United States Patent
Boulestin

(10) Patent No.: US 10,727,799 B2
(45) Date of Patent: Jul. 28, 2020

(54) VARIABLE GAIN AMPLIFIER IN A RECEIVING CHAIN

(71) Applicant: STMicroelectronics S.A., Montrouge (FR)

(72) Inventor: Renald Boulestin, Grenoble (FR)

(73) Assignee: STMICROELECTRONICS S.A., Montrouge (FR)

( * ) Notice: Subject to any disclaimer, the term of this patent is extended or adjusted under 35 U.S.C. 154(b) by 0 days.

(21) Appl. No.: 16/428,413

(22) Filed: May 31, 2019

(65) Prior Publication Data

US 2019/0372539 A1  Dec. 5, 2019

(30) Foreign Application Priority Data

May 31, 2018  (FR) ..................... 18 54670

(51) Int. Cl.
*H03G 3/30* (2006.01)
*H03F 3/19* (2006.01)
*H03K 5/24* (2006.01)
*H04B 1/06* (2006.01)

(52) U.S. Cl.
CPC ............ *H03G 3/3036* (2013.01); *H03F 3/19* (2013.01); *H03K 5/24* (2013.01); *H04B 1/06* (2013.01); *H03G 2201/103* (2013.01)

(58) Field of Classification Search
CPC .......... H03G 3/3036; H03F 3/19; H03K 5/24; H04B 1/06
See application file for complete search history.

(56) References Cited

U.S. PATENT DOCUMENTS

| 4,675,594 | A | 6/1987 | Reinke | |
|---|---|---|---|---|
| 2006/0284671 | A1* | 12/2006 | Ohba | .................. H03F 3/45183 330/9 |
| 2015/0303887 | A1* | 10/2015 | Brunner | ............... H03G 3/3042 330/254 |
| 2017/0244371 | A1 | 8/2017 | Turker Melek et al. | |

* cited by examiner

*Primary Examiner* — Jaison Joseph
(74) *Attorney, Agent, or Firm* — Slater Matsil, LLP

(57) ABSTRACT

A variable gain amplifier includes a pair of amplification and recentering branches. Each branch includes: a resistive element of variable resistance configured to be driven by a variable gain controller; a digitally-driven variable current source configured to be driven by a compensation current driver unit; a first transistor comprising a gate terminal coupled to an input terminal of the variable gain amplifier, and a source terminal coupled to a first terminal of the resistive element; and a second transistor comprising a gate terminal coupled to a drain terminal of the first transistor, and a source terminal coupled to an output terminal of the variable gain amplifier.

20 Claims, 4 Drawing Sheets

VARIABLE GAIN AMPLIFIER IN A RECEIVING CHAIN

CROSS-REFERENCE TO RELATED APPLICATIONS

This application claims the benefit of French Application No. 1854670, filed on May 31, 2018, which application is hereby incorporated herein by reference.

TECHNICAL FIELD

Embodiments of the invention relate to communication devices, and in particular embodiments to a variable gain amplifier in a receiving chain.

BACKGROUND

A near field communication (NFC) device generally includes a chain for receiving a signal connected to an antenna.

FIG. 1 shows a receive chain Rx connected to an antenna ANT and including an antenna coupling stage 1 generally including connecting capacitors and a balun.

The antenna coupling stage 1 decomposes the signal received by the antenna ANT into two signals in phase opposition with respect to each other.

An input of stage 1 is connected to the antenna ANT and each of the two outputs of stage 1 (e.g., providing the two signals in phase opposition with respect to each other) is connected to a different input of a variable gain amplifier 2 including an amplifier, for example transistors connected as followers.

Each of the outputs of the amplifier 2 is connected to a different input of an analog-to-digital converter (ADC) 4 by the intermediary of an anti-aliasing filter 3.

The amplifier 2 is driven by a variable gain controller 5, which may be referred to as an automatic gain control (AGC).

The controller 5 is connected to the converter 4 and includes a state machine that controls the value of the gain of the amplifier 2 according to the resolution of the converter 4 in such a way that the amplitude of a signal received by the converter 4 is contained within the maximum dynamic range of the converter 4.

The converter 4 drives the controller 5.

During a first step, the amplifier 2 determines the maximum gain permissible by the converter 4.

The maximum gain obtained is maintained constant as long as the intensity of the signal has not been modified, that is to say as long as the distance between the transmitter of the signal and the antenna ANT of the receiver Rx remains constant.

However, the signals received by the amplifier 2 include a common mode voltage offset.

FIG. 2 shows a signal S1 received on one of the inputs of the amplifier 2 exhibiting an offset DEC1 (e.g. common mode voltage offset) and the amplitudes $A_{SUP}$ and $A_{INF}$ representing the dynamic range of the converter 4.

The offset of the signal received on each input can be of different value.

It is assumed that the gain of the amplifier has been determined such that the signal S1 amplified by the amplifier 2 is contained within the dynamic range of the converter 4.

Let S2 be the result of signal Si having been amplified by the amplifier 2.

It is observed that a part of the signal S2 is not contained within the dynamic range of the converter 2. The multiplication of the offset DEC1 of the signal S1 by the gain of the amplifier 2 has created an offset DEC2 of the signal S2 greater than the offset DEC1.

The amplitude of the signal S2 at the output of the amplifier 2 is greater than the maximum dynamic range of the converter 4.

Only the part of the signal S2 contained within the dynamic range of the converter 4 is converted into a digital signal. This results in a large error in the digital signal obtained at the output of the converter 4 with respect to the signal received by the antenna ANT.

Connecting capacitors, placed at the output of the amplifier 2, make it possible to bias the signals at a different level. However, the offset signal is transmitted to the amplifier 2 and can saturate the latter.

Another known solution includes oversizing the analog-to-digital converter so as to increase its dynamic range.

However, such a converter gives rise to an increase in energy consumption, of the area of the amplifier circuit and of the cost.

There is a need for a variable gain amplifier compensating for the offsets of the signals received on each of its inputs.

SUMMARY

According to implementations and embodiments, it is advantageously proposed to recenter the signals received by the variable gain amplifier at all times, whatever the gain of the amplifier may be.

According to one aspect, there is proposed a variable gain amplifier including two separate amplification and recentering branches, each of the branches including a resistive element of variable resistance, an input terminal intended for receiving a signal, an output terminal, a digitally driven variable current source and a follower transistor, the gate of the follower transistor being coupled to the input terminal, the drain being coupled to the output terminal and the source being coupled to a terminal of the resistive element and to an output of the current source, the variable current source being able to be driven by a compensation current driver unit and the resistive element being able to be driven by a variable gain controller.

According to one embodiment, the current driver unit is able to drive the variable current source according to the value of the gain of the amplifier and of a digital reference word.

According to one embodiment, the amplifier includes moreover a cascode transistor, the source of the cascode transistor being coupled to the output of the variable current source and the drain being coupled to the source of the follower transistor and to the terminal of the resistive element.

According to another aspect, there is proposed a receive chain including an amplifier such as defined above, a comparator including two inputs each connected to the output terminal of a different amplification branch and an output connected to a calibration input of the current driver unit and a variable gain controller being connected to a control input of the unit.

According to yet another aspect, there is proposed a method for amplifying and recentering a signal in a receive chain including a calibration step during which:

a resistive element of variable resistance incorporated in each of the two branches for amplifying and recentering a signal is driven in such a way that the value of the gain between an input terminal and an output terminal of each of the branches is equal to the highest value of gain that can be achieved by the branch;

variable current sources included in the branches are driven in such a way that the signals at the output terminals of the two branches cross each other and the digital driver word of each source is saved.

A linear relationship is established between the value of the gain of the amplifying and recentering branch and the value of the compensation currents delivered by the current sources.

According to one implementation, the method includes moreover a utilization step during which the resistive element are driven in such a way that the gain between the input terminal and the output terminal of each of the branches is equal to the highest value of gain achievable by the branches and then the value of the gain is reduced until the signal is included within the resolution of a digital-to-analog converter and the driving of the current sources is adjusted in proportion to the value of the gain by taking as a reference the reference digital word corresponding to the maximum gain.

The compensation for the offset of an input signal of an amplification and recentering branch is adapted in real time, that is to say for all of the variations in the value of the amplification gain.

BRIEF DESCRIPTION OF THE DRAWINGS

Other advantages and features of the invention will become apparent on examination of the detailed description of embodiments, which are in no way limiting, and of the appended drawings in which.

DETAILED DESCRIPTION OF ILLUSTRATIVE EMBODIMENTS

Embodiments relate generally to near field communication (NFC) devices and variable gain amplifiers included in receive chains of NFC devices.

Figure 1:
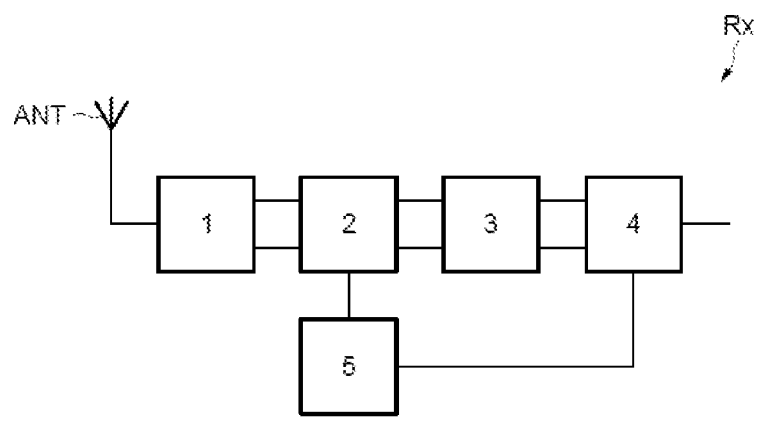
FIGS. 1 and 2, previously described, show embodiments of a variable gain amplifier according to the prior art.
Figure 2:
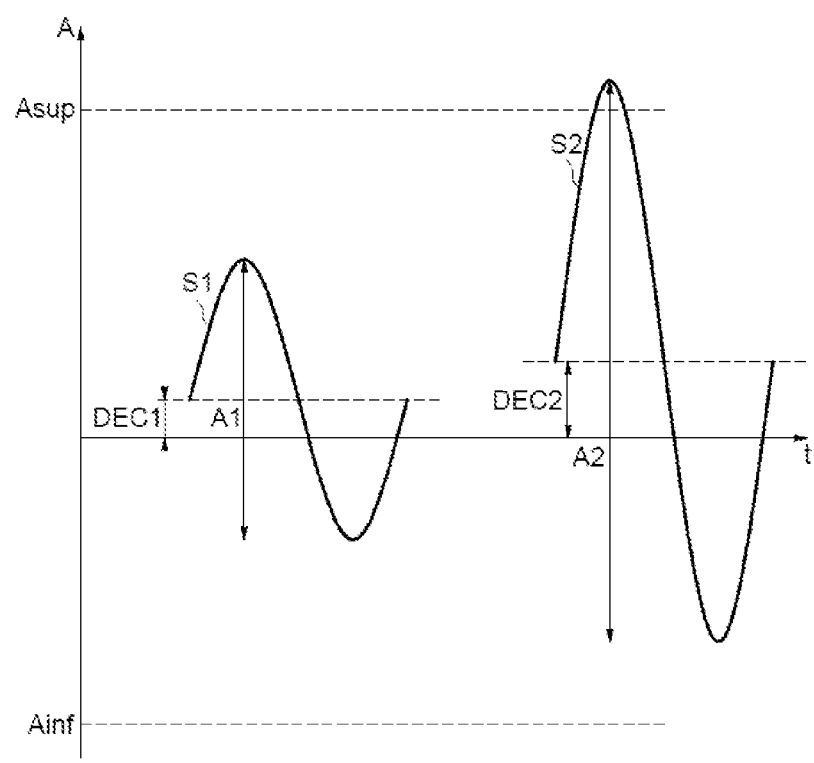
Figure 3:
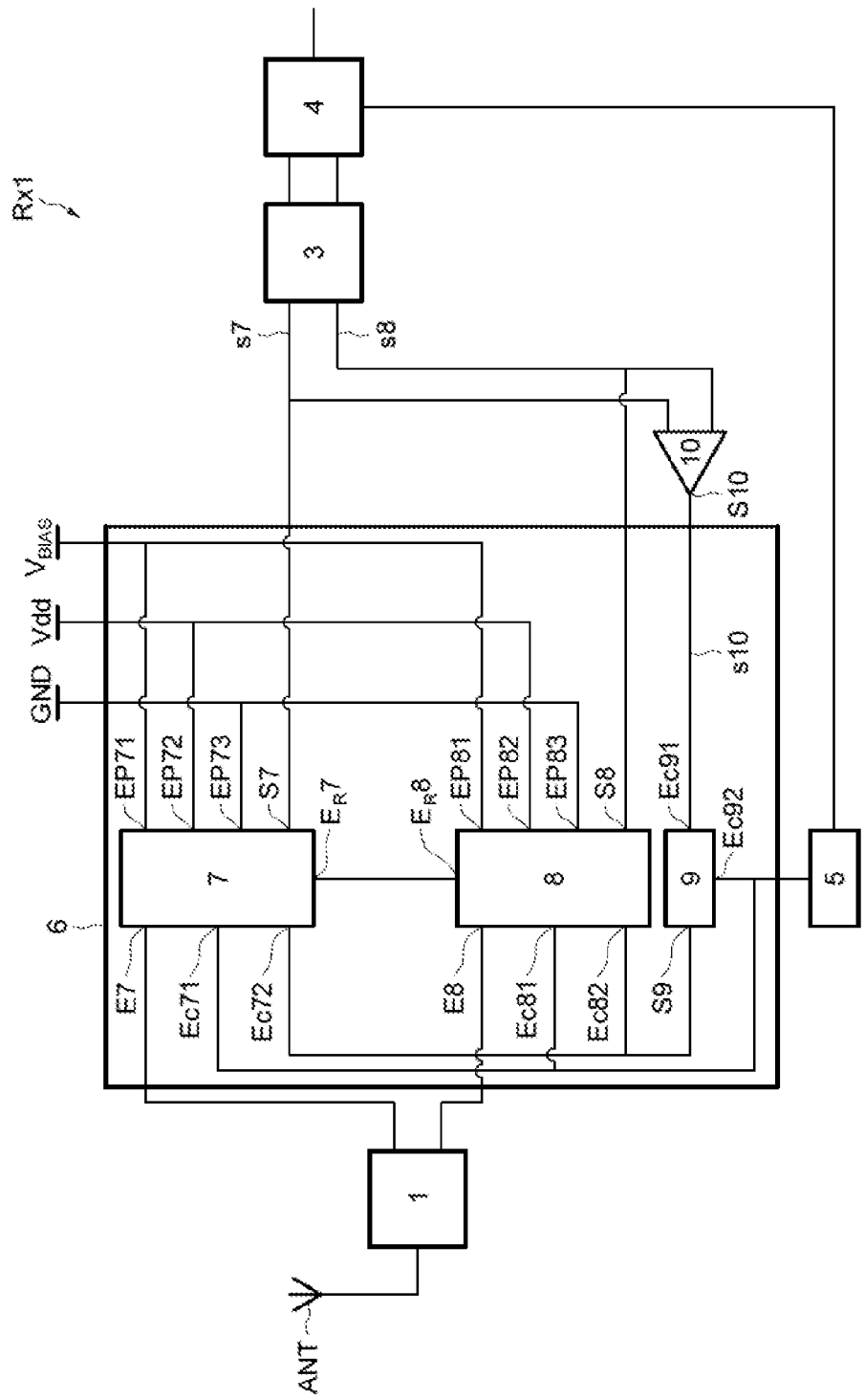
FIGS. 3 to 7 show different embodiments and implementations of the invention.

Reference is made to FIG. 3, which shows an example embodiment of a receive chain Rx1 including a variable gain amplifier 6 coupled to the antenna ANT.

The antenna coupling stage 1 (implemented using coupling stages known in the art) is connected to the antenna ANT, and the anti-aliasing filter 3 (implemented using anti-aliasing filters known in the art) is connected to the analog-to-digital filter 4 and the variable gain controller 5 connected to the converter 4 are again present.

The amplifier 6 includes two branches 7 and 8 for amplifying and recentering a signal and a compensation current driver unit 9 coupled to the two branches 7 and 8.

The current driver unit 9 can be included in the amplifier 6 as shown in this case or it can be outside of the amplifier 6.

The two branches 7 and 8 are identical in structure.

The first branch 7 includes an input E7 connected to a first output of the antenna coupling stage 1, and an output S7 connected to a first input of the filter 3 and upon which a signal 57 flows. The first branch 7 also includes a first, second, and third potential inputs EP71, EP72, and EP73, which are respectively connected to a first reference potential VBIAS, a second reference potential Vdd, and ground GND.

The branch 7 includes moreover a first control input Ec71 connected to the variable gain controller 5, and a second control input Ec72 connected to an output S9 of the compensation current driver unit 9. The branch 7 also includes an input ER7.

The compensation current driver unit 9 includes a calibration input Ec91 connected to an output S10 of a comparator 10 upon which a signal s10 flows. The compensation current driver unit 9 also includes control input Ec92 connected to the controller 5.

The comparator 10 includes two inputs each connected to a different output of the amplifier 6.

The second branch 8 includes an input E8 connected to a second output of the antenna coupling stage 1, and an output S8 connected to a second input of the filter 3 upon which a signal s8 flows. The second branch 8 also includes a first, second, and third potential input EP81, EP82, and EP83, which are respectively connected to the first reference potential VBIAS, the second reference potential Vdd, and ground GND.

The branch 8 includes a first control input Ec81 connected to the variable gain controller 5, and a second control input Ec82 connected to an output S9 of the compensation current driver unit 9. The branch 8 further includes input $E_R8$.

The inputs $E_R7$ and $E_R8$ of the branches 7 and 8 are connected to each other.

The signals s7 and s8 are in phase opposition with respect to each other.

As the two branches 7 and 8 are identical, only the first branch 7 is described in detail below. The features described with reference to the first branch 7 apply correspondingly to the second branch 8.

Figure 4:
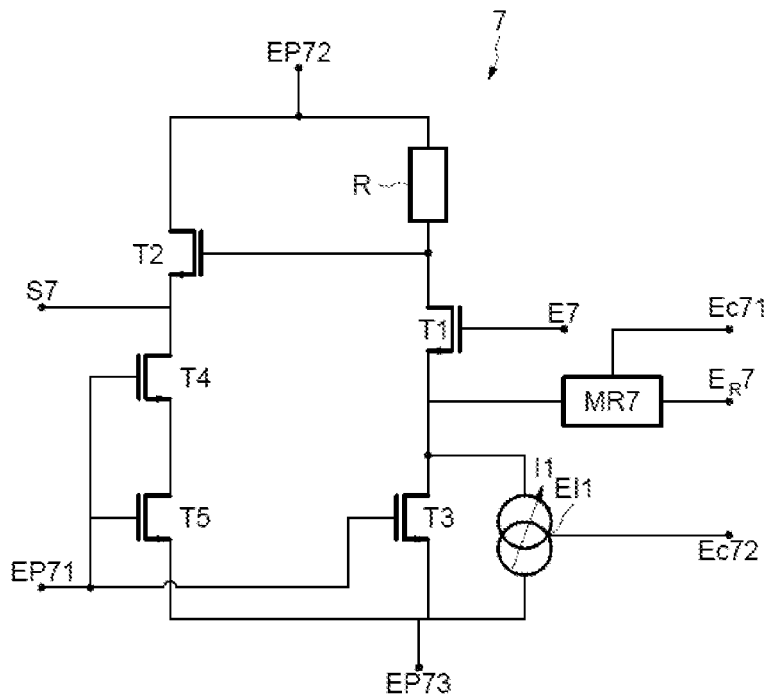

Reference is made to FIG. 4 which shows a first example of embodiment of the branch 7 including transistors, an ohmic resistor R, a current source I1 and a resistive element of variable resistance MR7.

The transistors are all identical and are, for example, field effect transistors of the MOS type.

The gate of a first follower transistor T1 is connected to the input terminal E7 and the drain of the first follower transistor T1 is connected to a first terminal of the ohmic resistor R and to the gate of a second follower transistor T2. The source of the first transistor T1 is connected to a first terminal of the variable resistance element MR7, to the drain of a third transistor T3 and to an output terminal of the digitally controlled variable current source I1.

A second terminal of the variable resistance element MR7 is connected to the input $E_R7$.

The variable resistance element MR7 includes a driver input connected to the first control input Ec71.

The current source I1 includes moreover a control input EI1 connected to the second control input Ec7 and a terminal connected to the third potential input EP73.

The source of the third transistor T3 is connected to the third potential input EP73 and the gate of the transistor T3 is connected to the first potential input EP71.

A second end of the resistor R and the drain of the second follower transistor T2 are connected to the second potential input EP72.

The source of the follower transistor T2 is connected to the output S7 and to the drain of a first cascode transistor T4.

The source of the first cascode transistor T4 is connected to the drain of a second cascode transistor T5.

The source of the second cascode transistor T5 is connected to the third potential input EP73.

The gate of the first cascode transistor T4 and the gate second cascode transistor T5 are connected to the first potential input EP71.

The cascode transistors T4 and T5 match the output impedance of the branch 7.

According to another embodiment, the cascode transistors T4 and T5 can be replaced by a single transistor.

The value of the first reference potential VBIAS is chosen such that the gate voltages of the first and second cascode transistors T4 and T5 and of the third transistor T3 are higher than their threshold voltage.

The first reference potential $V_{BIAS}$ can for example be generated by copying a current, for example of the bandgap voltage divided by a resistance of a resistive element of the same type as the variable resistance element MR7.

The second reference potential Vdd is chosen as a function of the technology of the transistors used and serves to bias the transistors connected to the first potential input EP71.

The value of the amplification gain G of the amplifying branch 7 is equal to the value of the ohmic resistor R divided by the value of the resistance of the variable resistance element MR7.

Figure 5:
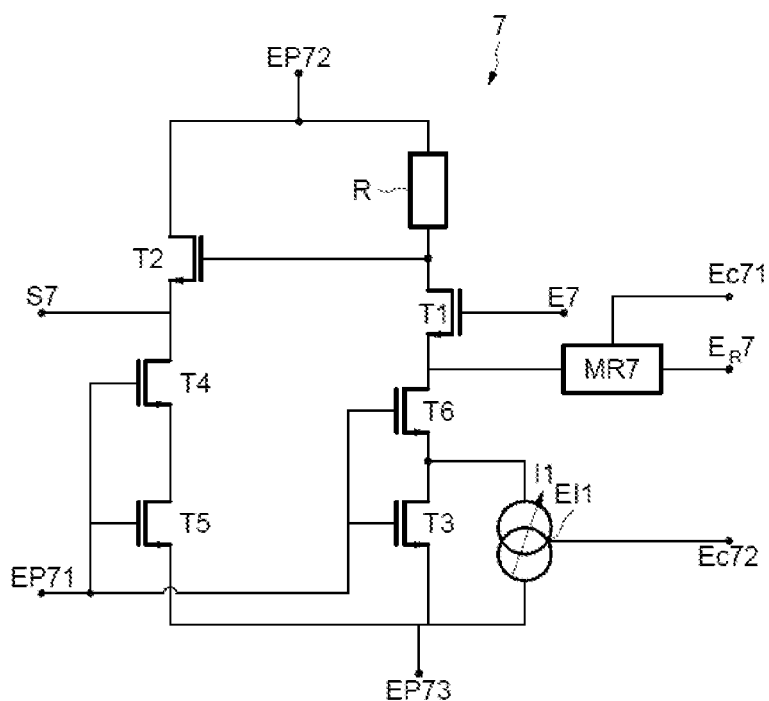

Reference is now made to FIG. 5 which shows a second example of embodiment of the branch 7.

The second example of embodiment is identical to the first example of embodiment of the branch 7 described above except that it includes a third cascode transistor T6 the drain of which is connected to the source of the first follower transistor T1, the gate is connected to the first potential input EP71 and the source is connected to the output of the digitally controlled current source I1.

The third cascode transistor T6 reduces the fluctuations (e.g. glitches) of the current delivered by the current source I1.

Figure 6:
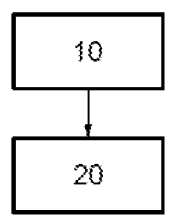

Reference is now made to FIG. 6 which describes an example of use of the variable gain amplifier 6.

When put into operation, the amplifier 6 operates with a maximum gain. It is necessary to calibrate the amplifier 6 during a calibration step 10 before the first use of the amplifier. The calibration step 10 is followed by a step 20 of use of the amplifier 6.

Figure 7:
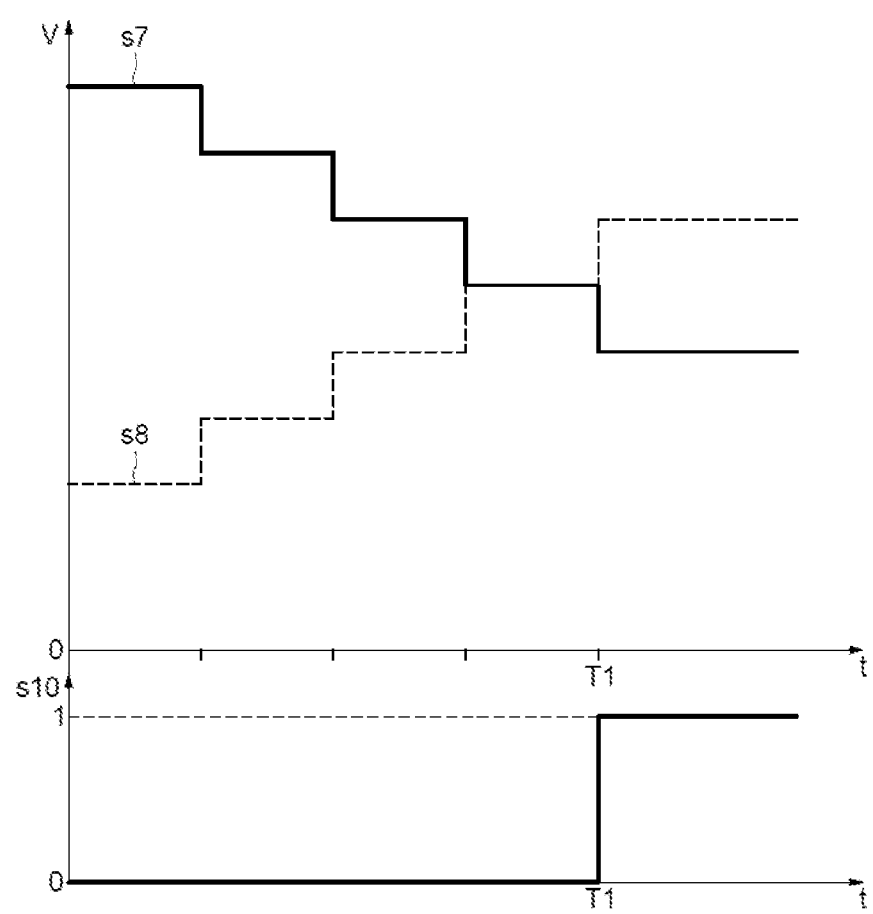

Reference is now made to FIG. 7 which describes an example of use of the variable gain amplifier 6 during the calibration step.

The amplifier 6 receives on each of its inputs E7 and E8 a signal including a random non-zero offset.

During the calibration step 10, the variable gain controller 5 drives the resistive element of variable resistance of each of the branches in such a way that the value of the gain of each of the branches of the amplifier 6 is equal to the maximum value of gain and then the compensation current driver unit 9 drives the variable current sources of the branches 7 and 8 in such a way that the output signals s7 and s8 of the amplifier cross each other.

The maximum gain value of each of the branches is equal to the highest gain value achievable by the branch. This value is defined during the sizing of the amplifier and is dependent on the value of the ohmic resistor and on the value of the resistance of the variable resistance element of each of the branches.

When the signals s7 and s8 cross each other, the output signal s10 of the comparator changes from logic "0" to logic "1".

The signals s7 and s8 cross each other at the time T1 and consequently the signal s10 changes to "1" at the time T1.

The current drive unit 9 reads the logic drive word of each of the current sources of each of the branches 7 and 8 at the time of the crossover of the signals s7 and s8 and saves the digital words.

These digital words correspond to the reference digital words associated with the maximum value of the gain of the variable gain amplifier 6 and make it possible to compensate the offsets of the signals received by the amplifier 6 so as to recenter the signals at the maximum gain value.

When the calibration step 10 is finished, it is followed by the utilization step 20.

During the utilization step 20, the variable gain controller 5 drives the resistive element of each of the branches 7 and 8 in such a way that the value of the gain of the amplifier 6 is equal to the maximum gain value and supplies the value of the gain to the current driver unit 9.

The current driver unit 9 adapts the driving of the current sources of the branches 7 and 8 according to the value of the reference digital words.

The controller 5 then drives the resistive element of each of the branches 7 and 8 in such a way that the gain of the amplifier 6 reduces, for example by one gain unit, until the signal received by the analog to digital converter 4 is included within the resolution of the converter 4.

At each reduction of the gain, the current driver unit 9 adjusts the driving of the current sources in proportion to the received value of the gain by taking as reference the reference digital word corresponding to the previously determined maximum gain.

It should be noted that a complementary branch 7 could be produced.

In other words, the value of the currents is determined in proportion to the value of the gain.

Advantageously, the amplifier 6 matches the value of the compensation currents to the value of the gain of the amplifier in real time.

The signals received by the analog to digital converter are conditioned by the amplifier in such a way that they are included within the resolution of the converter. Consequently, the converter is not saturated by the received signals.

What is claimed is:

1. A variable gain amplifier comprising a pair of amplification and recentering branches, wherein each branch comprises:
    a resistive element of variable resistance configured to be driven by a variable gain controller;
    a digitally-driven variable current source configured to be driven by a compensation current driver unit;
    a first transistor comprising a gate terminal coupled to an input terminal of the variable gain amplifier, and a source terminal coupled to a first terminal of the resistive element; and
    a second transistor comprising a gate terminal coupled to a drain terminal of the first transistor, and a source terminal coupled to an output terminal of the variable gain amplifier.

2. The variable gain amplifier according to claim 1, further comprising the compensation current driver unit, wherein the compensation current driver unit is configured to drive the digitally-driven variable current source based on a gain of the variable gain amplifier and a digital reference word.

3. The variable gain amplifier according to claim 1, further comprising a third transistor comprising a drain terminal coupled to the output terminal of the digitally-driven variable current source.

4. The variable gain amplifier according to claim 3, further comprising a pair of cascode transistors, the pair of cascode transistors comprising:
  a fourth transistor comprising a drain terminal coupled to the source terminal of the second transistor and the output terminal of the variable gain amplifier; and
  a fifth transistor comprising a drain terminal coupled to a source terminal of the fourth transistor, and a source terminal coupled to a source terminal of the third transistor.

5. The variable gain amplifier according to claim 4, wherein a gate terminal of the third transistor, a gate terminal of the fourth transistor, and a gate terminal of the fifth transistor are configured to receive a first reference potential.

6. The variable gain amplifier according to claim 5, wherein a drain terminal of the second transistor is configured to receive a second reference potential.

7. The variable gain amplifier according to claim 6, further comprising an ohmic resistive element comprising a first terminal coupled to the gate terminal of the second transistor and the drain terminal of the first transistor, and a second terminal coupled to receive the second reference potential.

8. The variable gain amplifier according to claim 4, wherein the source terminal of the third transistor and the source terminal of the fifth transistor are configured to receive a ground potential.

9. The variable gain amplifier according to claim 4, further comprising a sixth transistor comprising a drain terminal coupled to the source terminal of the first transistor and the first terminal of the resistive element, a source terminal coupled to the drain terminal of the third transistor and the output terminal of the digitally-driven variable current source, and a drain terminal coupled to the drain terminal of the fourth transistor and to the drain terminal of the fifth transistor.

10. The variable gain amplifier according to claim 1, wherein output signals of the pair of amplification and recentering branches are in phase opposition with respect to each other.

11. A receiver chain, comprising:
  an antenna configured to receive a signal;
  an antenna coupling stage coupled to the antenna and configured to decompose the signal into two signals in phase opposition with respect to each other;
  a compensation current driver unit;
  a variable gain controller, wherein the variable gain controller is coupled to a control input of the compensation current driver unit;
  a variable gain amplifier comprising a pair of amplification and recentring branches configured to respectively receive the two signals, the pair of amplification and recentering branches comprising respective output terminals, wherein each branch comprises:
    a resistive element of variable resistance configured to be driven by the variable gain controller;
    a digitally-driven variable current source configured to be driven by the compensation current driver unit;
    a first transistor comprising a gate terminal coupled to an input terminal of the variable gain amplifier, and a source terminal coupled to a first terminal of the resistive element; and
    a second transistor comprising a gate terminal coupled to a drain terminal of the first transistor, and a source terminal coupled to a respective output terminal of the branch; and
  a comparator comprising a pair of inputs respectively coupled to respective output terminals of the pair of amplification and recentering branches, and an output terminal coupled to a calibration input of the compensation current driver unit.

12. The receiver chain according to claim 11, wherein the compensation current driver unit is configured to drive the digitally-driven variable current source based on a gain of the variable gain amplifier and a digital reference word.

13. The receiver chain according to claim 11, wherein the variable gain amplifier further comprises a third transistor comprising a drain terminal coupled to the output terminal of the digitally-driven variable current source.

14. The receiver chain according to claim 13, wherein the variable gain amplifier further comprises a pair of cascode transistors, the pair of cascode transistors comprising:
  a fourth transistor comprising a drain terminal coupled to the source terminal of the second transistor and the output terminal of the variable gain amplifier; and
  a fifth transistor comprising a drain terminal coupled to a source terminal of the fourth transistor, and a source terminal coupled to a source terminal of the third transistor.

15. The receiver chain according to claim 14, wherein a gate terminal of the third transistor, a gate terminal of the fourth transistor, and a gate terminal of the fifth transistor are configured to receive a first reference potential.

16. The receiver chain according to claim 14, wherein a drain terminal of the second transistor is configured to receive a second reference potential.

17. The receiver chain according to claim 16, wherein the variable gain amplifier further comprises an ohmic resistive element comprising a first terminal coupled to the gate terminal of the second transistor and the drain terminal of the first transistor, and a second terminal coupled to receive the second reference potential.

18. The receiver chain according to claim 14, wherein the source terminal of the third transistor and the source terminal of the fifth transistor are configured to receive a ground potential.

19. A method for amplifying and recentering a signal in a receive chain, the method comprising:
  a calibrating each of two branches of a variable gain amplifier in the receive chain, the calibrating comprising:
    driving a resistive element of variable resistance of a respective branch of the two branches so that a gain between an input terminal and an output terminal of each branch is equal to the highest value of gain that can be achieved by the respective branch;
    driving a variable current source of each of the two branches so that amplitudes of signals at output terminals of the variable gain amplifier cross each other; and
  saving a reference digital driver word of each variable current source of the two branches, the reference digital driver word corresponding to the highest value of gain that can be achieved by the respective branch.

20. The method according to claim 19, further comprising:
  a utilization step following the calibrating, the utilization step comprising:

driving the resistive element so that the gain between the input terminal and the output terminal of each branch decreases from the highest value of gain that can be achievable by the respective branch until the signals at output terminals of the variable gain amplifier are included within a resolution of an analog to digital converter; and driving the variable current source of each of the two branches in proportion to the gain between the input terminal and the output terminal of each branch by taking, as a reference, the reference digital driver word of each branch.

\* \* \* \* \*